United States Patent [19]

Shelton

[11] Patent Number: 4,989,053
[45] Date of Patent: Jan. 29, 1991

[54] NONVOLATILE PROCESS COMPATIBLE WITH A DIGITAL AND ANALOG DOUBLE LEVEL METAL MOS PROCESS

[76] Inventor: Everett K. Shelton, 3586 Windspun Dr., Huntington Beach, Calif. 92649

[21] Appl. No.: 329,051

[22] Filed: Mar. 27, 1989

[51] Int. Cl.$^5$ ............... H01L 29/68; H01L 29/78; H01L 23/48; G11C 11/34
[52] U.S. Cl. .................... 357/23.5; 357/23.6; 357/68; 365/185
[58] Field of Search ............ 357/23.5, 23.6; 365/185; 437/52

[56] References Cited

U.S. PATENT DOCUMENTS

| 4,513,397 | 4/1985 | Ipri et al. | 357/23.5 |
| 4,597,000 | 6/1986 | Adam | 357/23.5 |
| 4,618,876 | 10/1986 | Stewart et al. | 357/54 |
| 4,646,425 | 3/1987 | Owens et al. | 437/43 |
| 4,833,096 | 5/1989 | Huang et al. | 437/43 |

FOREIGN PATENT DOCUMENTS

| 0202785 | 11/1986 | European Pat. Off. | |
| 0228761 | 7/1987 | European Pat. Off. | |
| 87491 | 7/1980 | Japan | 357/23.5 |
| 121980 | 7/1984 | Japan | 365/185 |
| 131484 | 6/1986 | Japan | 357/23.5 |

OTHER PUBLICATIONS

International Electron Devices Meeting, Dec. 9-12 1984, R. C. Stewart et al, "A Shielded Substrate Injector MOS (SSIMOS) EEPROM Cell" pp. 472-475.
International Electron Devices Meeting, Dec. 11-14 1988, H. Arima et al, "A Novel Process Technology and Cell Structure for Mega Bit EEPROM" pp. 420-423.

Primary Examiner—Rolf Hille
Assistant Examiner—Robert P. Limanek
Attorney, Agent, or Firm—Terje Gudmestad; W. K. Denson-Low

[57] ABSTRACT

A floating gate transistor structure including a semiconductor substrate, an access gate dielectrically separated from the substrate, and a floating gate having (a) a first portion dielectrically separated from the substrate by a floating gate oxide region and a tunnel oxide region and (b) a second portion at last partially overlying and dielectrically separated from the access gate. A metal control gate overlies and is dielectrically separated from the floating gate. Also disclosed is a precision capacitor having a doped region as a first capacitor plate and a metal gate as a second capacitor plate.

The floating gate transistor structure can be made with a process which includes the steps of forming a gate oxide layer on semiconductor substrate, forming an access gate on the gate oxide layer, and forming an interpoly oxide layer over the access gate and a floating gate oxide layer on the substrate laterally adjacent the gate oxide. A tunnel oxide region is formed in the floating gate oxide layer, and a floating gate is then formed on the interpoly oxide, the floating gate oxide, and the tunnel oxide. An oxide layer is formed over the floating gate, and a metal control gate is formed thereon. The precision capacitor is advantageously made pursuant to certain of the foregoing steps.

6 Claims, 2 Drawing Sheets

NONVOLATILE PROCESS COMPATIBLE WITH A DIGITAL AND ANALOG DOUBLE LEVEL METAL MOS PROCESS

BACKGROUND OF THE INVENTION

The disclosed invention is generally directed to metal-oxide-semiconductor (MOS) floating gate transistor structures, and is more particularly directed to a single or double level metal floating gate transistor structure which includes a metal programming gate and polysilicon access and floating gates, and also to a process for making such floating gate transistor.

Floating gate transistors are intended to retain either an "ON" or "OFF" state without any bias power to the circuit. Thus, floating gate transistors are utilized as non-volatile memory elements, whereby data is stored by appropriately programming floating gate transistors in the ON or OFF states. The respective states of the floating gate transistors are sensed by appropriate read circuitry. Floating gate IGFETs are discussed in *Physics of Semiconductor Devices*, Sze, John Wiley & Sons, pages 550–555, 1969.

A known floating gate structure includes a polysilicon floating gate and a polysilicon control/access gate which partially overlies and extends beyond the floating gate. The gates are separated by an "interpoly" oxide layer. Typically, the floating gate is formed with a first polysilicon layer process, while the control/access gate is formed with a second polysilicon layer process, which is also utilized to form any standard transistor gates (i.e., non-floating).

A consideration with the foregoing structure is that the interpoly oxide tends to be leaky, unless high temperature oxide processing is utilized. However, such high temperature oxide processing has been shown to degrade the quality of the tunnel oxide beneath the floating gate. Thus, a trade-off must be made between retention and endurance.

Another consideration with the foregoing structure is that the fabrication processing typically utilized provides for a standard gate oxide thickness which depends on the thickness required for the interpoly oxide. Utilization of more advanced processes for thinner gate oxide would present difficulties.

Another known structure is similar to the foregoing described structure, except that the functions of the gates are reversed. In other words, the first polysilicon layer gate is utilized as the control/access gate, while the second polysilicon layer gate is utilized as the floating gate. Such structure advantageously allows for formation of the tunnel oxide after formation of the interpoly oxide, thus allowing for formation of high quality interpoly oxide without damage to the tunnel oxide. Also, such structure allows for concurrent formation of the oxide beneath the floating gate (distinct from the tunnel oxide) and the interpoly oxide, thus providing for a consistent capacitive coupling between the control/access gate and the floating gate.

However, the capacitive coupling factor is reduced since the control/access gate cannot capacitively couple to the floating gate area that necessarily extends beyond the control/access gate in a second poly layer floating gate configuration. Also, due to the necessarily reduced narrow size of the control/access gate in the channel region, the control/access gate may have higher resistance which results in slower access time.

A further consideration with both of the foregoing known structures is that the control gate is also utilized as the access gate, which results in a loss of charge on the floating gate after repeated read operations and decreased retention of the floating gate structure. This configuration also causes the "read" states of the floating gate transistor to have different degrees of "on", instead of being "off" or "on". An accurate reference device is required to be able to read the different "on" states, which complicates design.

SUMMARY OF THE INVENTION

It would therefore be an advantage to provide a floating gate transistor structure having improved capacitive coupling and improved oxide between the floating gate and the access gate.

Another advantage would be to provide a floating gate transistor structure which avoids substantial changes of the floating gate potential during read operations.

Still another advantage would be to provide a floating gate transistor structure having reduced access times.

The foregoing and other advantages and features are provided by the floating gate transistor structure of the invention which includes a semiconductor substrate, an access gate dielectrically separated from the substrate, and a floating gate having (a) a first portion dielectrically separated from the substrate by a floating gate oxide region and a tunnel oxide region and (b) a second portion at least partially overlying and dielectrically separated from the access gate. A metal control gate overlies and is dielectrically separated from the floating gate.

A further aspect of the invention is a process for making a floating gate transistor which includes the steps of forming a gate oxide layer on semiconductor substrate, forming an access gate on the gate oxide layer, and forming an interpoly oxide layer over the access gate and a floating gate oxide layer on the substrate laterally adjacent the gate oxide. A tunnel oxide region is formed in the floating gate oxide layer, and a floating gate is then formed on the interpoly oxide, the floating gate oxide, and the tunnel oxide. An oxide layer is formed over the floating gate, and a metal control gate is formed thereon.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
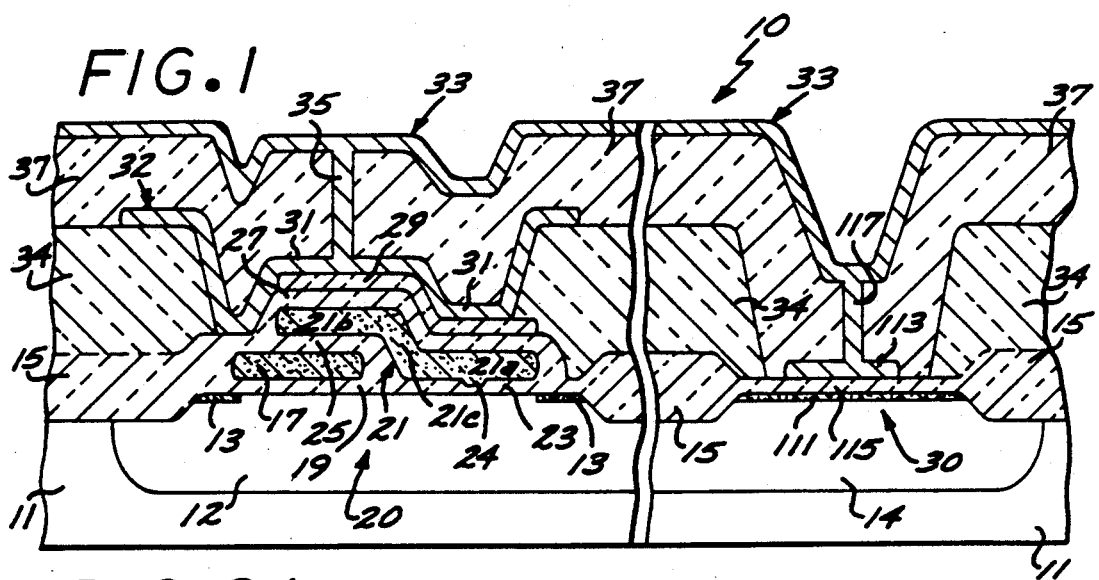
FIG. 1 is a schematic sectional view of the floating gate transistor structure of the invention, together with a precision metal gate capacitor which can be advantageously produced with the disclosed process for producing the transistor structure.

In the following detailed description and in the several figures of the drawing, like elements are identified with like reference numerals.

Referring now to FIG. 1, schematically illustrated therein is a partial sectional view of an integrated circuit 10 that includes a silicon substrate 11, which can be of an appropriate conductivity type and for this discussion will be N-type. Illustrative examples are shown of a non-volatile N-channel floating gate transistor 20 and a precision capacitor 30 formed in respective P− wells 12, 14 in the N− substrate 11. For ease of understanding, the floating gate transistor structure and the precision capacitor structure will be described separately.

The non-volatile floating gate transistor 20 includes N+ source and drain regions 13 formed in a device region of the P− well 12. Field oxide regions 15 separate and surround the device regions of the P− well 12. A polysilicon access gate 17 is formed over an access gate oxide layer 19 disposed on the P-well. It should be noted that the gates of standard (i.e., non-floating) transistors are also formed along with the polysilicon access gate 17.

The floating gate transistor 20 further includes a polysilicon floating gate 21 that includes two sections 21a, 21b at different elevations which are connected by a transition section 21c. The floating gate section 21a is disposed on a floating gate oxide layer 23 formed on the substrate 11, while the floating gate section 21b is disposed on an interpoly oxide layer 25 formed over the polysilicon access gate 17 so as to at least partially overlie the polysilicon access gate 17. The transition section 21c is also separated from the access gate 17 by the interpoly oxide layer 25.

A thin tunnel oxide region 24 is formed in the floating gate oxide layer 23, and a downwardly extending portion of the floating gate section 21a is disposed over the tunnel oxide region 24.

An oxide layer 27 is formed on the polysilicon floating gate 21, and an optional nitride layer 29 can be formed on the oxide layer 27. A metal control gate 31 is disposed over the floating gate 21, for example on the nitride layer 29 if utilized, or on the oxide layer 27 if the nitride layer 29 is not utilized. The metal control gate 31 is formed as part of a patterned first metallization layer 32 which is formed on a deposited phosphorus doped oxide (PVX) layer 34 having an opening for the metal gate 31. The metal gate 31 may be conductively connected to a patterned second metallization layer 33 by a conductor 35 disposed in a via formed in an inter-metal oxide layer 37 that separates the first and second patterned metallization layers. Alternatively, the interconnections for the metal gate 31 can be in the first metallization layer 32.

Referring now to the precision capacitor 30, it includes an N+ region 111 in the P− well 14 between field oxide regions 15. The N+ region 111 is preferably formed at the same time as the source and drain regions 13 of the floating gate transistor 20, and comprises the lower plate of the precision capacitor 30. The other plate of the capacitor 30 is a metal capacitor gate 113 which is dielectrically separated from the N+ region by a capacitor oxide layer 115. The metal capacitor gate is formed through an opening in the PVX layer 34 as part of the first patterned metallization layer 32, and is conductively connected to the patterned second metallization layer 33 by a conductor 117 formed in a via in the intermetal oxide layer 37.

The foregoing non-volatile floating gate transistor 20 and the precision capacitor 30 can be formed pursuant to the following process steps.

Figure 2A:
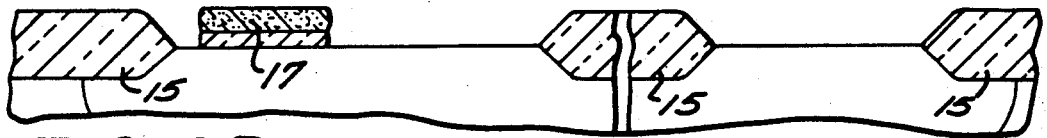
FIGS. 2A through 2G are schematic sectional views helpful in understanding a process for producing the floating gate transistor structure and precision capacitor of FIG. 1.

Gate oxide and field oxide regions 15 are appropriately formed in an appropriately doped substrate. A first blanket layer of polysilicon is formed on the exposed oxide surfaces, for example by standard low pressure chemical vapor deposition. The deposited polysilicon layer is doped with an appropriate impurity such as phosphorus pursuant to known techniques, for example by ion implantation or diffusion. The polysilicon access gates 17, as well as the gates of standard transistors, are defined by an appropriately patterned photoresist mask, and the unwanted portions of the polysilicon layer are etched, for example by polysilicon plasma etching. The exposed gate oxide is then etched, for example by oxide plasma etching, to expose the unprotected surfaces of the P− wells 12, 14. The resulting structure, after removal of the photoresist, is shown in FIG. 2A.

Figure 2B:
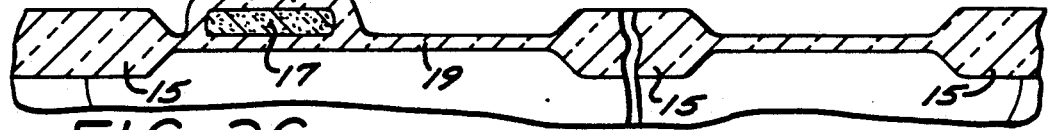

The interpoly oxide 25 and the floating gate oxide 23 are formed by oxidation at a relatively high temperature above 1050 degrees C in dry oxygen, for example, which provides for low leakage oxide. The resulting structure is shown in FIG. 2B.

The regions for the tunnel oxide 24 are defined by an appropriately patterned photoresist layer, and the floating gate oxide exposed by such photoresist pattern is etched, for example, by plasma etching or wet etching, to the substrate 11. The thin tunnel oxide 24 is then grown.

A second blanket layer of polysilicon is formed on the exposed oxide surfaces, for example by standard low pressure chemical vapor deposition. The deposited polysilicon layer is doped with an appropriate impurity such as phosphorus pursuant to ion implantation. The doped polysilicon layer is then oxidized to form a thin layer of oxide.

If the nitride layer 29 over the polysilicon floating gate 21 is to be utilized, a blanket layer of silicon nitride is deposited on the thin oxide layer, for example, by standard low pressure chemical vapor deposition.

Figure 2C:
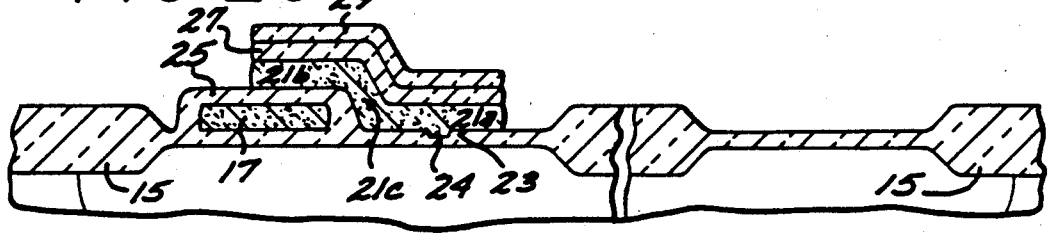

The floating gate regions are then defined by an appropriately patterned photoresist mask, and the nitride layer (if utilized) and the oxide over the second polysilicon layer are etched, for example by nitride/oxide plasma etching. The second polysilicon layer is then etched, for example by polysilicon plasma etching, to form the floating gates 21. The resulting etched structure in shown in FIG. 2C.

Figure 2D:
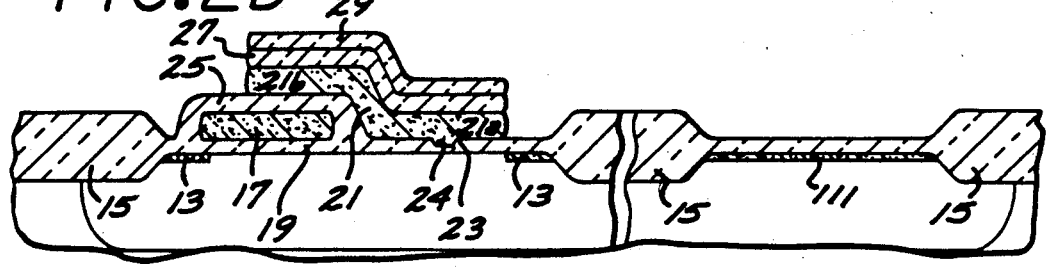

The source and drain regions 13 of the floating gate transistors and the bottom capacitor plates 111 of the precision capacitors are then implanted, for example by ion implantation of phosphorus pursuant to known techniques. The resulting structure is schematically illustrated in FIG. 2D.

Figure 2E:
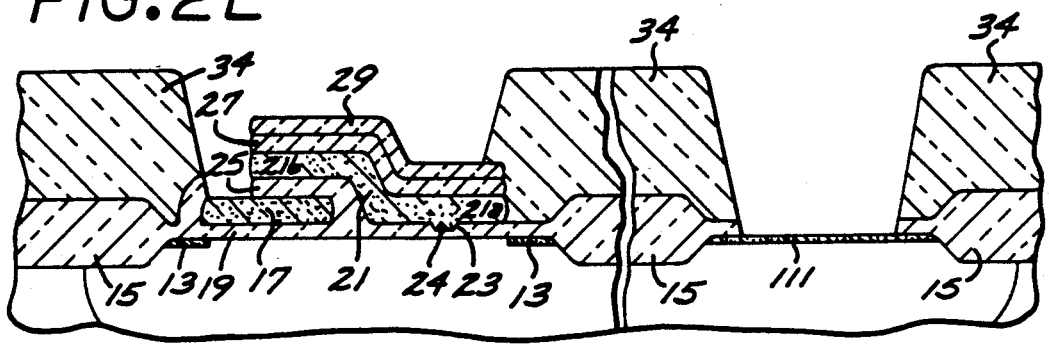

A blanket layer of phosphorus doped oxide (PVX) is then deposited on the exposed surfaces of the wafer, for example, by low pressure, low temperature chemical vapor deposition. Openings for contacts, the metal control gates 31 of the floating gate transistors, and the metal gates 113 of the precision capacitors are defined by an appropriately patterned photomask, which for example can be patterned to allow for the metal control gates 31 to overlap the associated polysilicon floating gates 21. That is, the metal control gates 31 do not have to be confined to being above the nitride regions 29. With openings for metal control gates 31 that overlap the associated polysilicon floating gates 21, some edge portions of the floating gates 21 could be exposed when etched. The wafer is then etched to produce such openings, for example, by plasma etching. Specifically, the PVX is etched to the silicon substrate in the precision capacitor regions and to the nitride layer 29 and the polysilicon access gates 17 portions not protected by nitride 29 in the floating gate transistor regions. The structure resulting after removal of the photoresist is schematically illustrated in FIG. 2E.

Figure 2F:
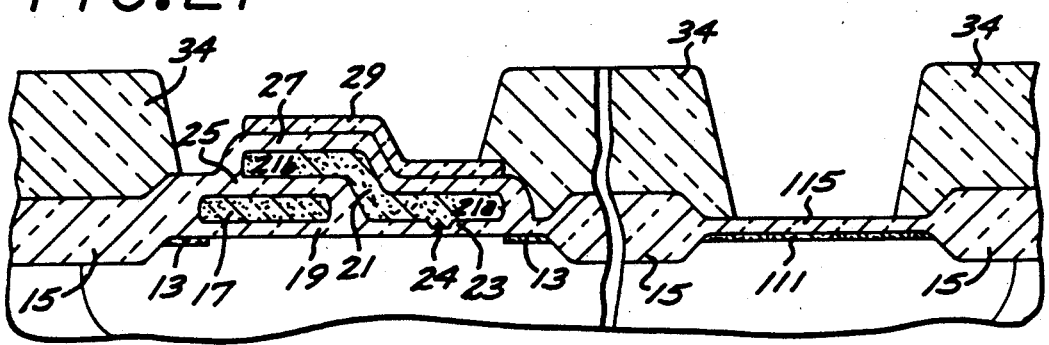

The etched PVX is reflowed, at which time the capacitor oxide 115 for any precision capacitors is grown by oxidation during reflow. Also during reflow, any exposed edges of the polysilicon floating gates 21 and exposed areas of the access gates 17 are oxidized. The resulting structure is schematically illustrated in FIG. 2F.

Figure 2G:
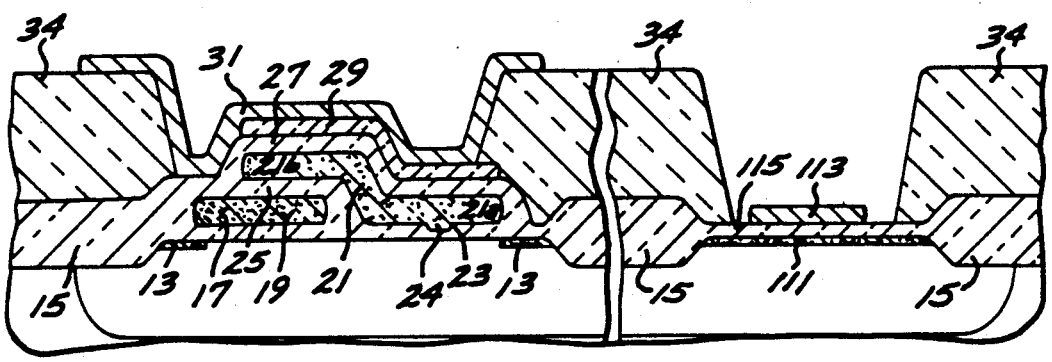

After PVX reflow, a blanket layer of metallization is applied to the reflowed etched PVX 34 by sputtering, for example. The desired pattern of the first metallization layer 32, including the metal control gates 31 of the floating gate transistors and the metal gates 113 of the precision capacitors, is defined by an appropriately patterned photoresist mask formed on the metallization layer. The metal control gates 31 can be patterned to overlap the associated floating gates 21 so as to provide for maximum capacitive coupling. The metallization layer is then subjected to photoresist mask and etch processing to remove the unwanted metallization. The structure resulting after removal of photoresist is schematically illustrated in FIG. 2G.

After etching of the first metallization layer, a blanket oxide layer is deposited on the patterned first metallization layer to form the intermetal oxide layer 37. The locations of via openings, including via openings to metal control gates 31 formed in the first metallization layer 32 if desired, are defined by an appropriately patterned photoresist formed on the oxide layer. The oxide layer is etched, for example, by oxide plasma etching.

A blanket layer of metallization is then applied by sputtering, for example, to form the second metallization layer 33 and to fill the via openings. The second metallization layer 33 is patterned pursuant to photoresist masking and etching, and can include interconnections for the metal control gates 31 which avoids possible interference with source and drain lines that would be formed in the first metallization layer 32 for some memory implementations. The resulting structure after removal of photoresist is schematically illustrated in FIG. 1.

It should be appreciated that the interconnections for the metal control gates 31 could also be provided in the first metallization layer 32. Also, the foregoing devices can be implemented with single metal layer processing.

While the foregoing has been directed to N-channel devices, it should be readily appreciated by persons skilled in the art that the disclosed structures and processes can be implemented for P-channel devices, and can also be implemented with CMOS processes which include both N-channel and P-channel devices.

While the foregoing has been directed to the formation of floating gate transistors in the transistor regions, it should be appreciated that 2-terminal capacitors having polysilicon plates or metal and polysilicon plates could be formed. Specifically, a polysilicon access gate and its associated "floating gate" (which would not float in this configuration) could form a capacitor with appropriate via openings and connections in the first metallization layer. Also, a metal gate and its associated "floating gate" could form a capacitor with an appropriate via opening to the "floating gate" and connections in the first and second metallization layers. Such a metal/polysilicon capacitor would advantageously provide a high capacitance per unit area.

Also, if desired, metal contacts can be provided to otherwise 'floating gates' so as to form specialized transistors, including reference transistors for example.

The foregoing has been a disclosure of a non-volatile floating gate transistor having low-leakage interpoly oxide and floating gate oxide, together with optimized tunnel oxide, which provides for reliable retention and high endurance cycles. Further, the thickness of the standard (non-floating) gate oxide is independent of the thickness of the interpoly and the floating gate oxide, which allows for use of advanced thinner non-floating gate oxide processing. The disclosed floating gate transistor also provides for a higher coupling factor from control gate to floating gate, which allows for lower programming voltages.

Separate control and access gates are advantageously provided, which eliminates "read disturb" effects (i.e., the loss of stored charge on floating gates as a result of many read operations) and allows for simpler sensing techniques (e.g., without a reference cell). Specifically, the metal gates can be grounded during a read operation while the access gates are pulsed high, which prevents a substantial change of the voltage on the floating gates as a result of the high capacitance between the floating gates and the associated metal control gates, and also the relatively low capacitance between the floating gates and the associated access gates. Preventing substantial change of the voltage on the floating gates avoids the "read disturb" effects.

The separate control and access gates are also advantageously utilized in programming. Specifically, the metal control gates can be connected to respective polysilicon access gates during programming in order to increase the capacitance between (a) the floating gate and (b) the effective control gate comprising the metal gate and the access gate. The higher capacitance provides a higher coupling factor, which requires a lower minimum programming voltage.

It should be noted that in some memory array applications wherein the control gates and access gates for each row are permanently connected, the disclosed floating gate transistor structure provides for reduced access time. In such applications, the access gates for a given row comprise a continuous polysilicon strip extending across all floating gate transistors in that row, while the metal control gates for that row would be connected together by metal. The connection between the metal gates and the polysilicon access gates can be made, for example by standard contacts at intervals along the row between a metal gate and its associated access gate. Such structure effectively shorts out the resistance of the polysilicon gate at the intervals, making the maximum series resistance much lower, and reducing access time. Additionally, this configuration is also optimum for lowest programming voltage due to the high capacitive coupling resulting from having both gates next to the floating gate. It should be appreciated however that the advantages of separate control and access gates are not available with this configuration.

The disclosed process provides for compatible non-volatile and analog device processing, and is compatible with existing CMOS processes. The process allows for production of higher quality tunnel oxides and isolating oxides between polysilicon layers.

Although the foregoing has been a description and illustration of specific embodiments of the invention, various modifications and changes thereto can be made by persons skilled in the art without departing from the scope and spirit of the invention as defined by the following claims.

What is claimed is:

1. A non-volatile transistor structure comprising:
   a semiconductor substrate;
   a polysilicon access gate dielectrically separated from said substrate;
   a polysilicon floating gate having (a) a first portion dielectrically separated from said substrate by a low leakage floating gate oxide layer and a tunnel oxide region, and (b) a second portion at least partially overlying and dielectrically separated from said polysilicon access gate by a low leakage interpoly dielectric layer; and
   a metal control gate overlying and dielectrically separated from said floating gate.

2. The structure of claim 1 wherein said interpoly and floating gate layers ar comprised of oxide layers formed at a relatively high temperature in dry oxygen.

3. The structure of claim 1 wherein said control gate is connected to said access gate to provide increased capacitance between said floating gate and said connected control and access gates.

4. The structure of claim 1 including a patterned metallized layer overlying and dielectrically separated from said metal control gate, and a conductor interconnecting said metal control gate and said patterned metallized layer.

5. The structure claim 4 wherein said patterned metallized layer is spaced from said metal gate by an inter-metal oxide layer having a via, said conductor extending through said via.

6. The structure of claim 1 including a layer of phosphorus doped oxide on exposed surfaces of said substrate, said last mentioned layer having an opening receiving said control gate, said opening extending to said access gate, an inter-metal oxide layer overlying said control gate, a metallization layer overlying said inter-metallization oxide layer, and a connector interconnecting said control gate and said metallization layer.

* * * * *